(12) United States Patent
Kim et al.

(10) Patent No.: US 7,973,575 B2
(45) Date of Patent: Jul. 5, 2011

(54) PROGRAMMABLE FREQUENCY DIVIDER AND FREQUENCY DIVIDING METHOD THEREOF

(75) Inventors: Soo-Won Kim, Seoul (KR); Kyu-Young Kim, Busan (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 193 days.

(21) Appl. No.: 12/392,856

(22) Filed: Feb. 25, 2009

(65) Prior Publication Data

US 2010/0054390 A1 Mar. 4, 2010

(30) Foreign Application Priority Data

Sep. 2, 2008 (KR) .................. 10-2008-0086297

(51) Int. Cl.
H03B 19/00 (2006.01)
(52) U.S. Cl. ........................ 327/117; 327/115
(58) Field of Classification Search .............. 327/47, 327/115, 117; 377/47
See application file for complete search history.

(56) References Cited

U.S. PATENT DOCUMENTS

| | | | |
|---|---|---|---|
| RE32,605 E | | 2/1988 | Yamashita et al. |
| 5,652,534 A | * | 7/1997 | Taylor et al. .................. 327/237 |
| 6,097,782 A | * | 8/2000 | Foroudi .......................... 377/47 |
| 6,952,121 B1 | * | 10/2005 | Vu ................................. 327/115 |
| 7,102,399 B2 | * | 9/2006 | Wu ................................ 327/156 |
| 7,282,969 B2 | * | 10/2007 | Shin et al. ...................... 327/115 |
| 7,492,852 B1 | * | 2/2009 | Liu ................................ 377/48 |
| 7,495,496 B2 | * | 2/2009 | Zhang et al. .................. 327/291 |

FOREIGN PATENT DOCUMENTS

EP 0 918 395 A2 5/1999

OTHER PUBLICATIONS

Rabaey, Jan. M., et al. "Digital Integrated Circuits—A Design Perspective", Second Edition, Prentiss Hall Electronics and VLSI Series, Cover and p. 215.

* cited by examiner

*Primary Examiner* — Hai L Nguyen
(74) *Attorney, Agent, or Firm* — Christie, Parker & Hale, LLP

(57) ABSTRACT

A programmable frequency divider, which is a core module of a frequency synthesizer using a Phase Locked Loop (PLL) for generating very high frequencies, includes a divided clock generator dividing a frequency of an input clock signal $F_{in}$ by a first divide ratio (N+1) or a second divide ratio N according to a divide ratio control signal MC to generate a plurality of divided clock signals $D_{out}$; a counting unit counting the number CNT of the plurality of divided clock signals $D_{out}$ by performing swallow mode counting and program mode counting sequentially on the plurality of divided clock signal $D_{out}$; a control signal generator generating the divide ratio control signal MC, using the number CNT of the plurality of divided clock signal $D_{out}$, a count S by the swallow mode counting and a count P by the program mode counting, the count P corresponding to a maximum of the number CNT, feeding the divide ratio control signal MC back to the divided clock generator, and generating a reset control signal RST for resetting the counting unit.

8 Claims, 8 Drawing Sheets

PROGRAMMABLE FREQUENCY DIVIDER AND FREQUENCY DIVIDING METHOD THEREOF

CROSS-REFERENCE TO RELATED APPLICATIONS

This application claims all benefits of Korean Patent Application No. 10-2008-0086297 filed on Sep. 2, 2008 in the Korean Intellectual Property Office, the disclosures of which are incorporated herein by reference.

BACKGROUND OF THE INVENTION

1. Field of the Invention

The present invention relates to a Programmable Frequency Divider (PFD) and a frequency dividing method thereof, and more particularly, to a programmable frequency divider which is a core module of a frequency synthesizer using a Phase Locked Loop (PLL) for generating very high frequencies, and a frequency dividing method thereof.

2. Description of the Related Art

With the recent development of mobile communication environments, frequency synthesizers allowing standards, such as a Global System for Mobile communications (GSM), Global Positioning System (GPS), DCS 1800, Wideband Code-Division Multiple Access (WCDMA), and wireless LAN, etc., to stably operate at a high frequency clock ranging from 0.9 to 2.4 GHz have gained importance.

A frequency synthesizer generally includes a programmable divider (PD) for adjusting a divide ratio to divide a high-speed clock. Since such a programmable divider divides a high-speed clock generated by a voltage-controlled oscillator (generally called "VCO"), power consumption is very high. Accordingly, significantly reducing power consumption is very important in a frequency synthesizer design to meet the increasing requirements of the frequency synthesizer.

FIG. 1 shows the construction of an existing programmable frequency divider.

Referring to FIG. 1, the existing programmable frequency divider includes a dual modulus prescaler (DMP) having a divide ratio of N or (N+1), a program counter (PC) for counting clocks upto P, and a swallow counter (SC) for counting clocks upto S, wherein N is a basic divide ratio of the DMP, P is an input value of the PC, and S is an input value of the SC set from the outside (P>S).

If a high-speed clock $F_{in}$ from a VCO of a PLL is input to the DMP, the DMP divides the high-speed clock $F_{in}$ by the divide ratio (N+1). The divided clocks $F_{in}/(N+1)$ are applied simultaneously to both the PC and SC, and the PC and SC each counts the number of the divided clocks $F_{in}/(N+1)$. Here, since P>S, the divided clocks $F_{in}/(N+1)$ are first counted upto S by the SC, and then a modulus control signal (hereinafter, referred to as a MC signal) which is an output signal of the SC goes logic high ('1'). In response to the MC signal which goes logic high, the DMP changes its divide ratio from (N+1) to N. The clocks $F_{in}/N$ divided by the DMP are again input to the PC, the PC counts the number of the clocks $F_{in}/N$ upto P, and when the count value reaches P, the PC generates a reset signal RST to reset the P and S values to '0'.

That is, the clock $F_{in}$ is divided by the divide ratio (N+1) until the count value reaches S, and until the count value reaches P from when it reaches S, the clock $F_{in}$ is divided at the divide ratio N. After the resetting, the counting and dividing operations described above are repeated.

A final divide ratio D of the clock $F_{in}$ obtained by repeatedly performing the counting and dividing operations can be expressed by the following Equation.

$$D=(n+1)*S+N*(P-S)=N*P+S$$

In FIG. 1, $F_{out}$ (that is, the output of the PD) are clocks obtained by dividing the $F_{in}$ by the final divide ratio D.

However, the existing programmable divider has very high fan-out since the DMP supplies clocks divided by itself simultaneously to the two counters (that is, the SC and PC), as described above. Due to such very high fan-out, operation performance at high frequencies cannot be ensured and the two counters perform the same function unnecessarily (that is, the two counters perform counting in parallel), which significantly increases power consumption of the frequency synthesizer and also causes an increase of the chip area, resulting in a great increase of manufacturing costs.

SUMMARY OF THE INVENTION

The present invention provides a programmable frequency divider and a frequency dividing method thereof, which can significantly reduce power consumption, in order to meet the current requirements of a frequency synthesizer and overcome the existing problems of a frequency divider which is a core modules of a frequency synthesizer.

According to an aspect of the present invention, there is provided a programmable frequency divider including: a divided clock generator dividing a frequency of an input clock signal $F_{in}$ by a first divide ratio (N+1) or a second divide ratio N according to a divide ratio control signal MC to generate a plurality of divided clock signals $D_{out}$; a counting unit counting the number CNT of the plurality of divided clock signals $D_{out}$, by performing swallow mode counting and program mode counting sequentially on the plurality of divided clock signal $D_{out}$; a control signal generator generating the divide ratio control signal MC, using the number of the plurality of divided clock signals $D_{out}$, a count S by the swallow mode counting and a count P by the program mode counting, the count P corresponding to a maximum of the number CNT of the plurality of clock signals $D_{out}$, feeding the divide ratio control signal MC back to the divided clock generator, and generating a reset control signal RST for resetting the counting unit.

The programmable frequency divider further includes a selector for selecting and outputting a count $M_{out}$ from among the count S and the count P, using the divide ratio control signal MC fed back from the control signal generator as a selection control signal.

The control signal generator includes: a counting mode converter converting a current counting mode for counting the number CNT of the plurality of divided clock signals into the swallow mode counting or the program mode counting, according to which one of the count S and the count P is selected; and a RST/MC signal generator generating the divide ratio control signal MC and the reset control signal RST, according to a conversion signal from the counting mode converter.

The RST/MC signal generator includes: a first flipflop receiving the conversion signal as a clock signal and dividing the conversion signal by two to generate the divide ratio control signal MC; and a second flipflop using a signal in a logic state inverse to that of the conversion signal as a clock signal and receiving a signal in a logic state inverse to that of the divide ratio control signal MC to generate the reset control signal RST.

According to another aspect of the present invention, there is provided a frequency dividing method including: dividing a frequency of an input clock signal $F_{in}$ by a first divide ratio (N+1) or a second divide ratio N according to a divide ratio control signal MC to generate a plurality of divided clock signals $D_{out}$; counting the number CNT of the plurality of divided clock signals $D_{out}$ by performing swallow mode counting and program mode counting sequentially on the plurality of divided clock signals $D_{out}$; generating the divide ratio control signal MC, using the number CNT of the plurality of divided clock signals $D_{out}$, a count S by the swallow mode counting and a count P by the program mode counting, the count P corresponding to a maximum of the number CNT of the plurality of clock signals $D_{out}$, and generating a reset control signal RST for resetting the number CNT of the plurality of divided clock signals $D_{out}$.

Therefore, since the frequency divider according to the present invention can replace two counters (a program counter (PC) and swallow counter (SC)) used in the existing frequency divider by one counter module, power consumption of a frequency synthesizer can be reduced and also fan-out can be reduced, which contributes to reduce manufacturing costs and ensure stable operation performance upon high-speed operation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EXEMPLARY EMBODIMENTS

Figure 1:
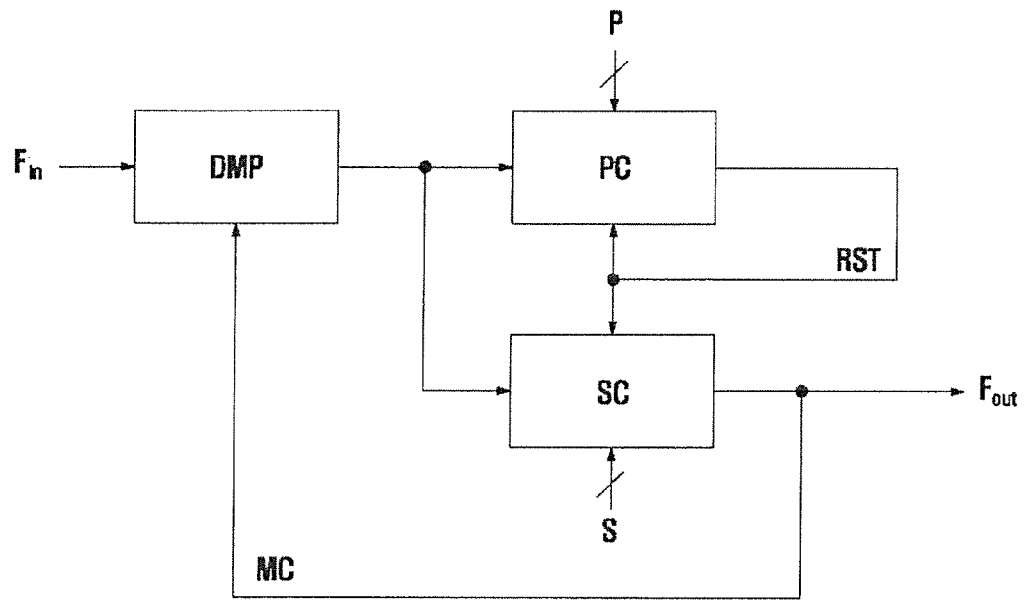
FIG. 1 shows a construction of an existing programmable frequency divider.

Prior to detailed description of the present invention, for easy understanding, an outline of a solution for achieving an object of the present invention will be described below.

A programmable frequency divider according to the present invention is aimed at low power consumption. An outline of a solution for achieving an object of the present invention is to reduce high fan-out and high power consumption caused by two counters (a program counter and swallow counter) used in the existing frequency divider by replacing the two counters by one counter module to perform swallow mode counting and program mode counting sequentially for low power consumption.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. Like reference numerals in the drawings denote like elements.

Figure 2A:
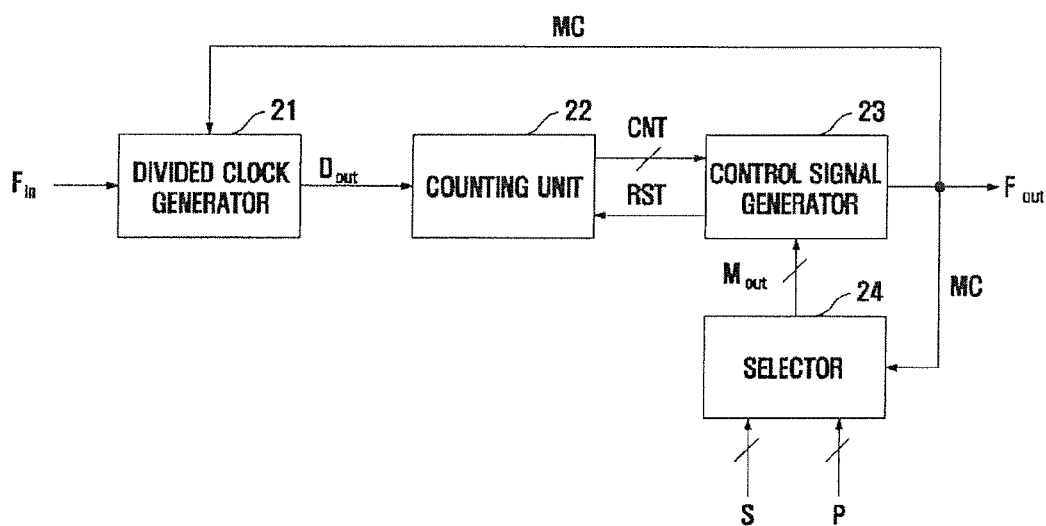
FIGS. 2A through 2D show a configuration of a programmable frequency divider according to an embodiment of the present invention.
Figure 2B:
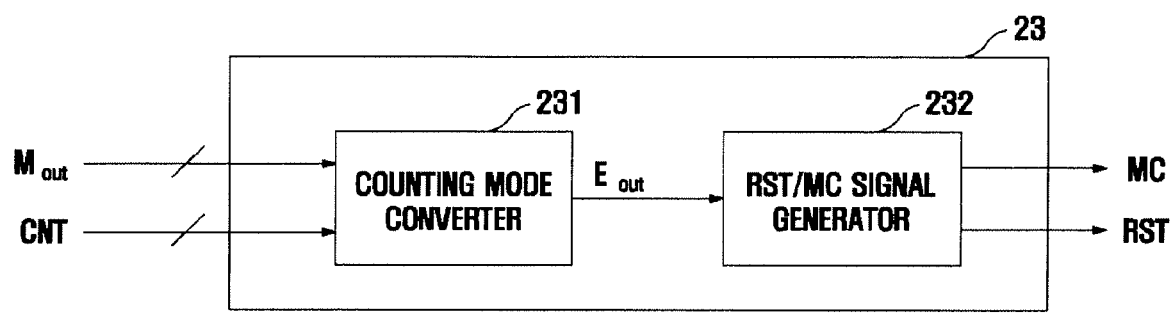
Figure 2C:
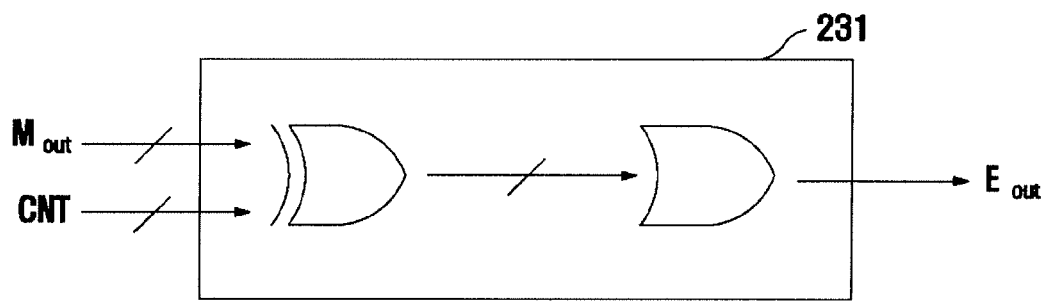
Figure 2D:
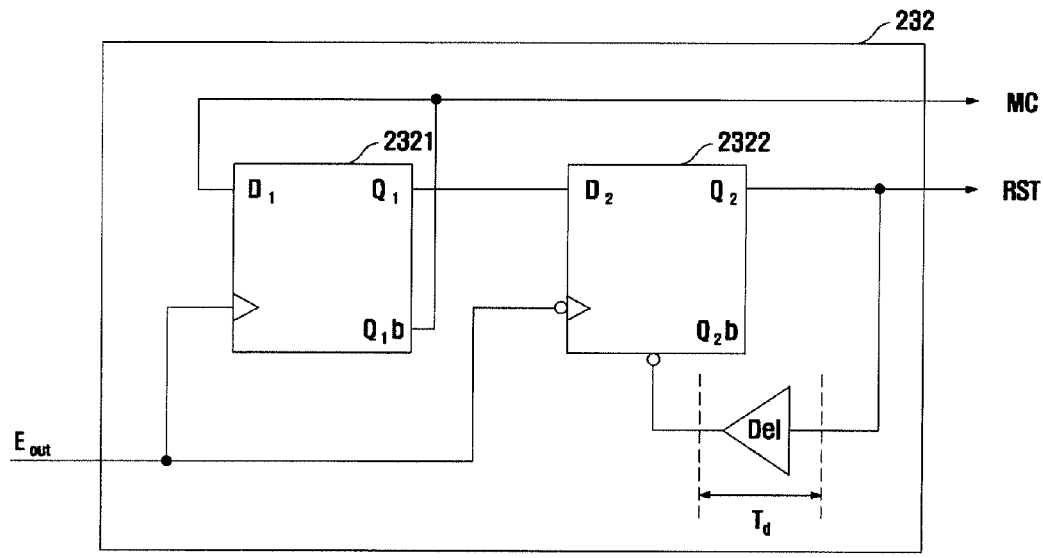
Figure 3A:
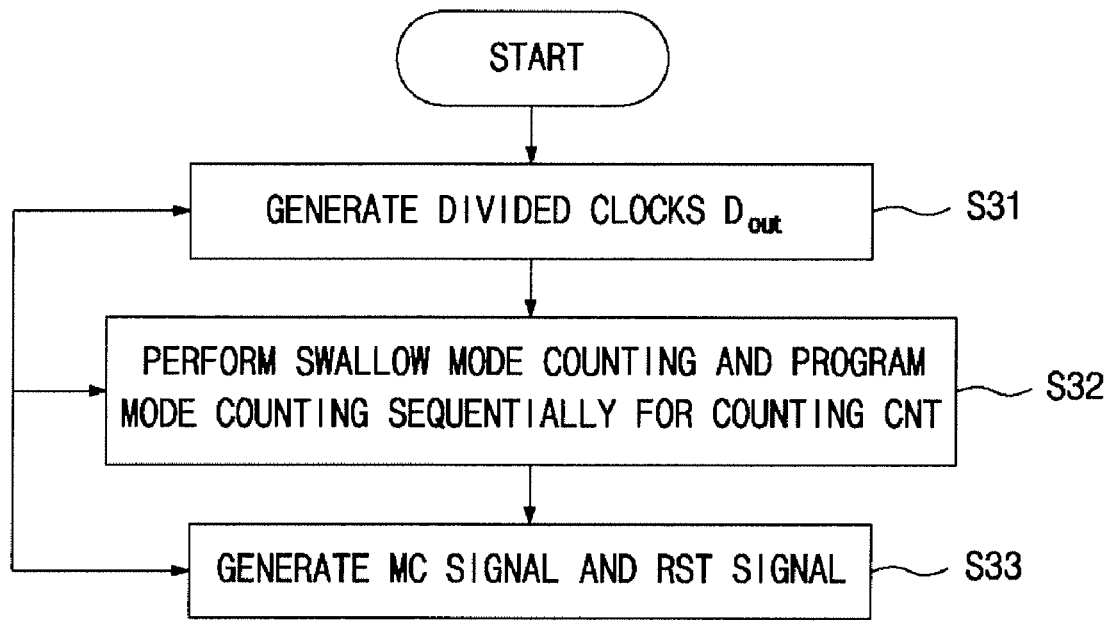
FIGS. 3A, 3B and 3C are flowcharts of a frequency dividing method according to an embodiment of the present invention.
Figure 3B:
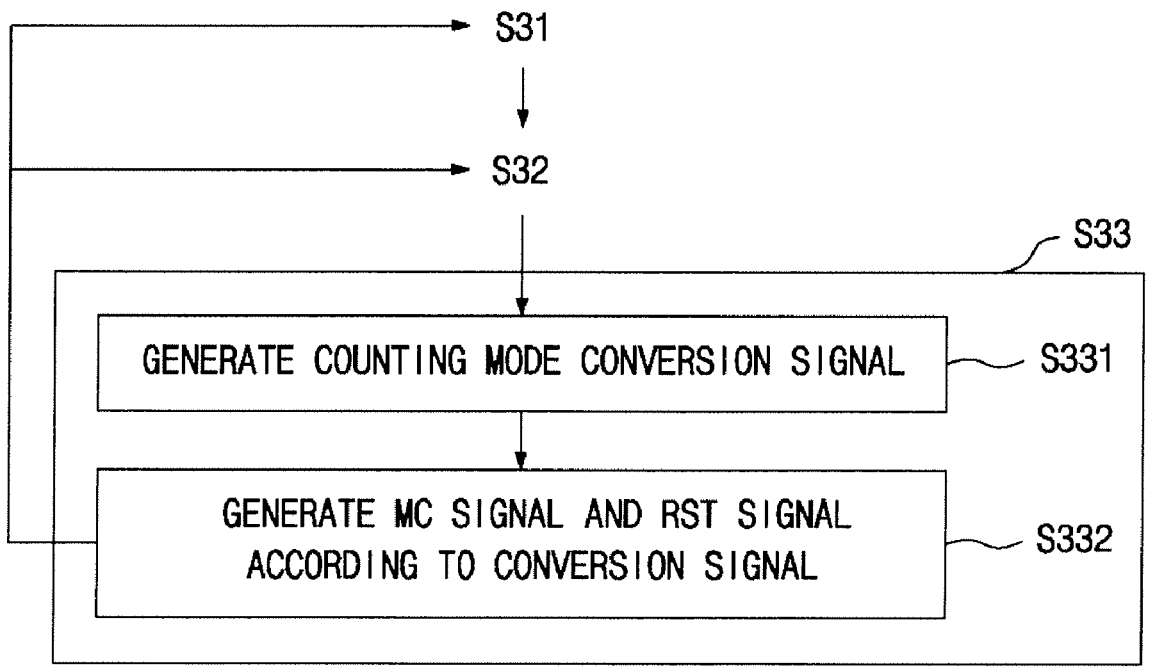
Figure 3C:
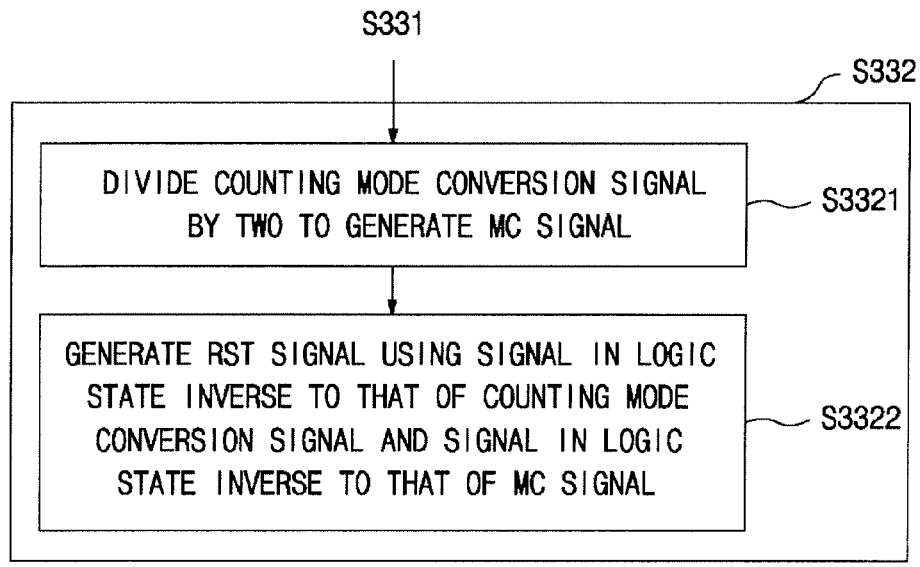

FIGS. 2A through 2D shows the configuration of a programmable frequency divider according to an embodiment of the present invention, and FIGS. 3A, 3B and 3C are flowcharts of a frequency dividing method according to an embodiment of the present invention.

Referring to FIG. 2A, the programmable frequency divider according to an embodiment of the present invention includes a divided clock generator 21, a counting unit 22, a control signal generator 23 and a selector 24.

The divided clock generator 21 performs operation (S31 of FIG. 3A) of generating a plurality of divided clocks $D_{out}$ by dividing a very high-speed input clock $F_{in}$ by a first divide ratio (N+1) or a second divide ratio N. The divided clock generator 21 may be a Dual Modulus Prescaler (DMP) used in the existing frequency divider. The divided clock generator 21 determines a frequency divide ratio for the input clock $F_{in}$ to N or (N+1) according to a logic state of a divide ratio control signal MC, wherein N is a basic divide ratio of a frequency divider and may be 4. The frequency divider according to the current embodiment is different from the existing frequency divider in view of a method of generating such a divide ratio control signal MC, which will be described later.

The counting unit 22 performs operation (S32 of FIG. 3A) of counting the number CNT of the plurality of divided clock signals $D_{out}$. That is, the counting unit 22 performs the functions of a program counter (PC) and a swallow counter (SC) of the existing frequency divider. As illustrated in FIG. 2A, the counting unit 22 integrates the functions of the PC and SC to perform program counting and swallow counting sequentially, unlike the PC and SC of the existing frequency divider performing counting in parallel (or independently), thus preventing the PC and SC from operating simultaneously and overlappingly.

The integration of counter functions is possible since a swallow mode count S and a program mode count P can be selectively used in real time by the MC signal, which will be described in detail later. Here, the S and P values are set from the outside, like the existing frequency divider. That is, the S and P values are determined by a device or environment, etc. to which the corresponding frequency divider is applied.

The control signal generator 23 performs operation (S33 of FIG. 3A) of generating the MC signal, using the CNT and S or P, wherein P corresponds to a maximum of the CNT, and then feeding the MC signal back to the divided clock generator 21 so that the divided clock generator 21 generates the divided clock signals $D_{out}$ by dividing the frequency of the input clock $F_{in}$ by the first divide ratio (N+1) or the second divide ratio N, and generating a reset signal RST for resetting the counting unit 22.

The operation of the control signal generator 23 will be described in detail with reference to FIGS. 2B through 2E, below.

Figure 2E:
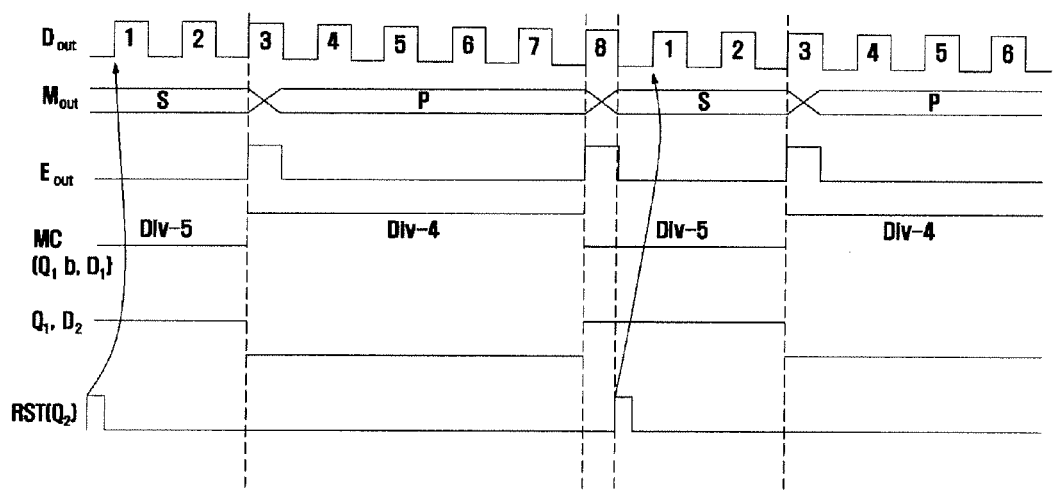
FIG. 2E is a timing diagram of signals associated with a control signal generator.

FIG. 2B shows the control signal generator 23 according to an embodiment of the present invention, and FIG. 2E is a timing diagram of signals associated with the control signal generator 23.

Referring to FIG. 2B, the control signal generator 23 according to the present invention includes a counting mode converter 231 and an RST/MC signal generator 232. For convenience of description regarding the operations of the control signal generator 23, it is assumed that S=3, P=8 and N=4. Also, $M_{out}$ which is an output of the selector 24 (see FIG. 2A) is one selected from among the swallow mode count S and the program mode count P using the modulus control signal MC as a selection control signal, wherein S is selected if the MC signal is logic low and P is selected if the MC signal is logic high. The selector 24 may be implemented by MUX which is one among logic circuits.

The counting mode converter 231 performs operation (operation S331 of FIG. 3B) of determining which one of the S and P values is selected and converting a current counting mode for counting the CNT into the swallow mode counting or program mode counting according to the result of the determination.

An exemplary embodiment of the counting mode converter 231 is illustrated in FIG. 2C.

If the CNT reaches "3", it is determined that the swallow mode counting is converted into the program mode counting (because the state of $M_{out}$ is changed), and accordingly, the output of an XOR device goes logic high and a counting mode conversion signal $E_{out}$ also goes logic high by an OR device, so that conversion of counting mode occurs. The state of the $M_{out}$ depends on the logic state of the MC signal. That is, if the MC signal is logic low, this is the swallow mode counting, and if the MC signal is logic high, this is the program mode counting.

If the conversion of the CNT from "3" to "4" is complete, this means that the counting mode for counting the CNT is stabilized to the program mode counting. Thus, the output of the XOR device goes logic low and accordingly the counting mode conversion signal $E_{out}$ goes logic low. That is, the counting mode conversion signal $E_{out}$ is changed from logic high to logic low during a period where the CNT is changed from "3" to "4", that is, during a period where the P is changed from "3" to "4", and stays logic low until the CNT reaches "8". The state of the $M_{out}$ is changed according to the counting mode of the CNT and the logic state of the MC signal, and accordingly, the logic state of the $E_{out}$ is changed periodically as illustrated in FIG. 2E.

The RST/MC signal generator 232 performs operation (S332 of FIG. 3C) of generating the MC signal and the RST signal according to conversion of counting mode. An exemplary embodiment of the RST/MC signal generator 232 is illustrated in FIG. 2D.

A first flopflop 2321 is a D-flipflop, and generates the MC signal by dividing its positive edge triggered clock $E_{out}$ by two, as shown in FIG. 2D (operation S3321 of FIG. 3C). The reason of dividing the $E_{out}$ by two is because the counting mode of the CNT is changed whenever the $E_{out}$ goes logic high, and if the counting mode is changed, the divide ratio of the divided clock generator 21 has to be changed from a first divide ratio "5" to a second divide ratio "4". The generated MC signal is fed back to the divided clock generator 21 so that the divided clock generator 21 can adjust its divide ratio to 4(Div-4) or 5(Div-5), and fed back to the selector 24 so that the selector 24 selects one from among the S and P values using the MC signal as a selection control signal and outputs the selected signal as $M_{out}$.

The second flipflop 2322 is a D-flipflop, and as illustrated in FIG. 2D, generates an RST signal by a negative edge triggered clock $E_{out}$ (operation S3322) and feeds back the RST signal to the counting unit 22, thus resetting the CNT to "0". A duration time of the RST signal is set to $T_d$ by a delay device Del.

After the CNT is reset to "0", the above-described counting is repeated and accordingly a final divide ratio D can be obtained as in the above equation.

Figure 4:
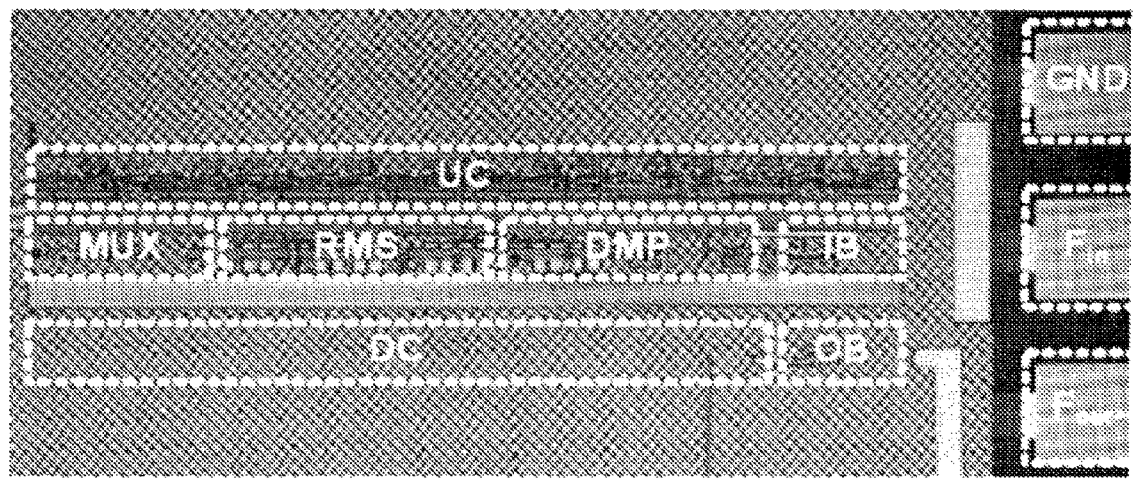
FIG. 4 is a photograph of a chip of the programmable frequency divider according to the present invention.

FIG. 4 is a photograph of a chip of the programmable frequency divider according to the present invention. The programmable frequency divider is manufactured by a CMOS 0.18 um process, and its entire area is 0.0408 mm². In FIG. 4, UC corresponds to the counting unit 22, DMP corresponds to the divided clock generator 21, RMS corresponds to the control signal generator 23, and MUX corresponds to the selector 24, respectively.

Figure 5A:
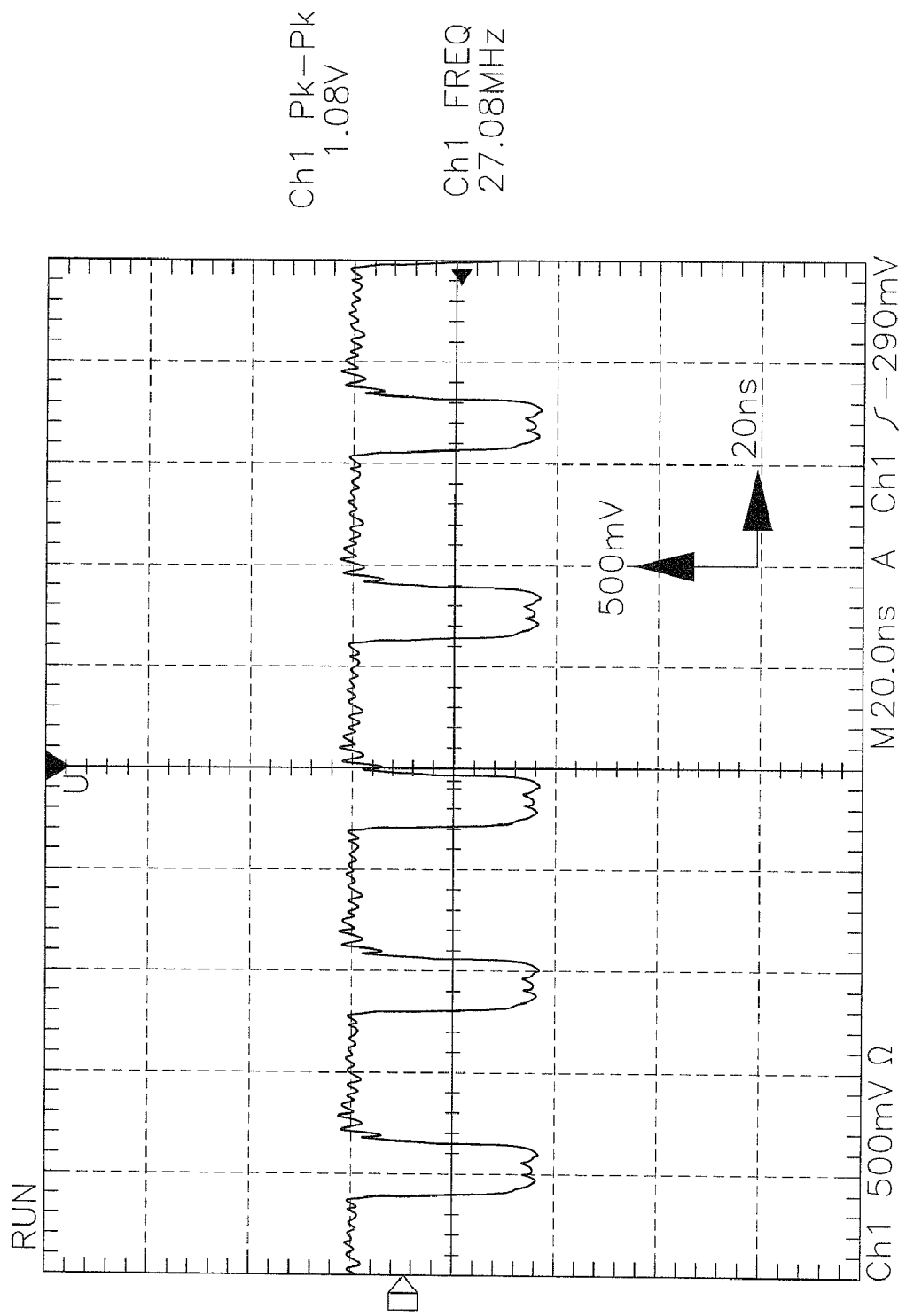
FIGS. 5A and 5B show examples of waveforms obtained by dividing an input clock $F_{in}$ at a divide ratio D by the frequency divider according to the present invention.
Figure 5B:
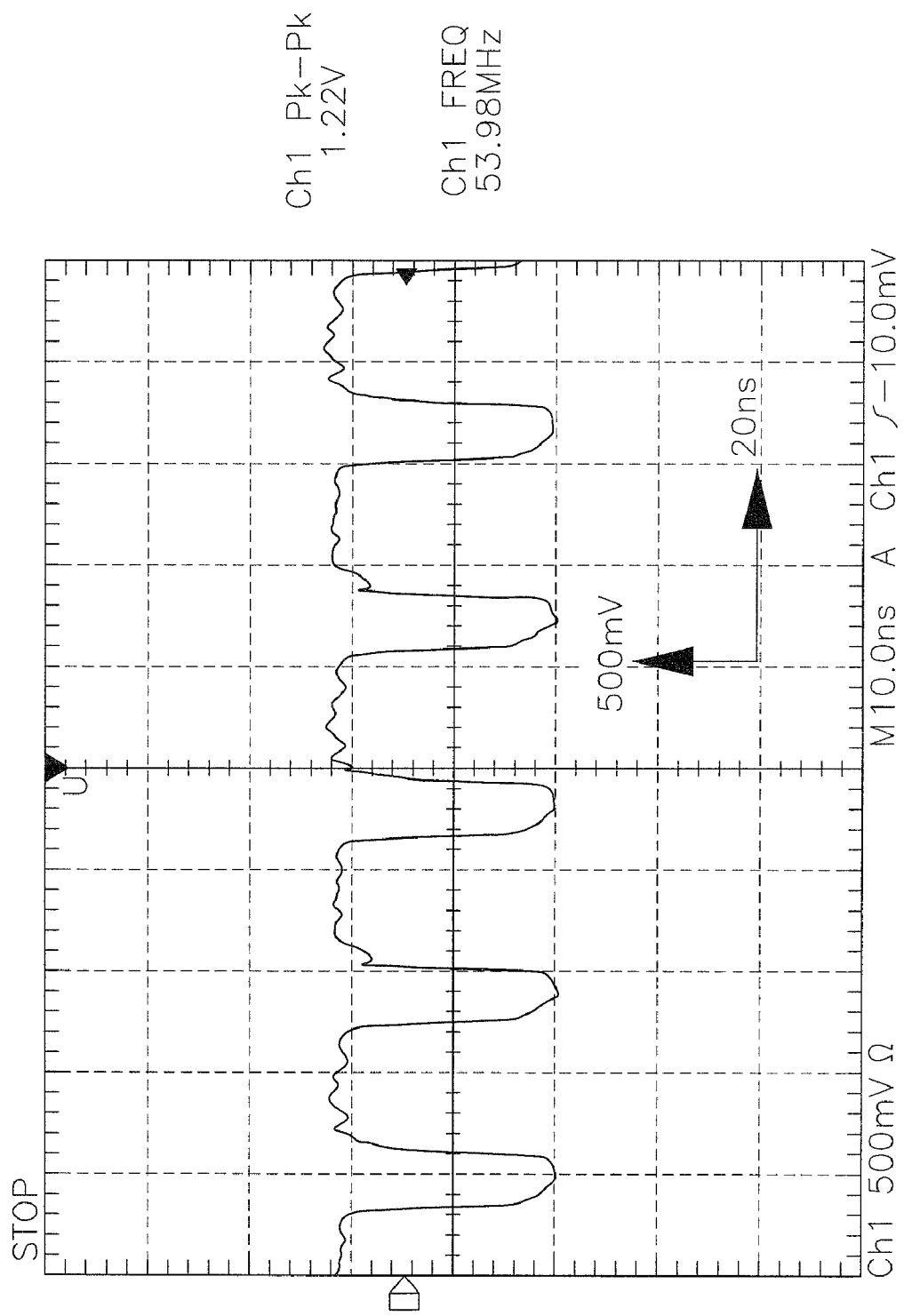

FIGS. 5A and 5B show examples of waveforms obtained by dividing the $F_{in}$ at a divide ratio D by the frequency divider according to the present invention. A clock of 2 GHz is applied to the $F_{in}$ using a general clock generator, and N is set to 4.

FIG. 5A corresponds to the case where P=17 and S=6, wherein a frequency $F_{out}$ of a divided waveform (that is, the MC signal) has been measured to 27.00 MHz. This value is equal to the result obtained using the above equation when D=74. FIG. 5B corresponds to the case where P=8 and S=5, where a frequency $F_{out}$ of a divided waveform (that is, the MC signal) has been measured to 54.00 MHz. This value is equal to the result obtained using the above equation when D=37. Through these measurement results, it will be understood that the programmable frequency divider according to the present invention correctly operates.

Figure 6:
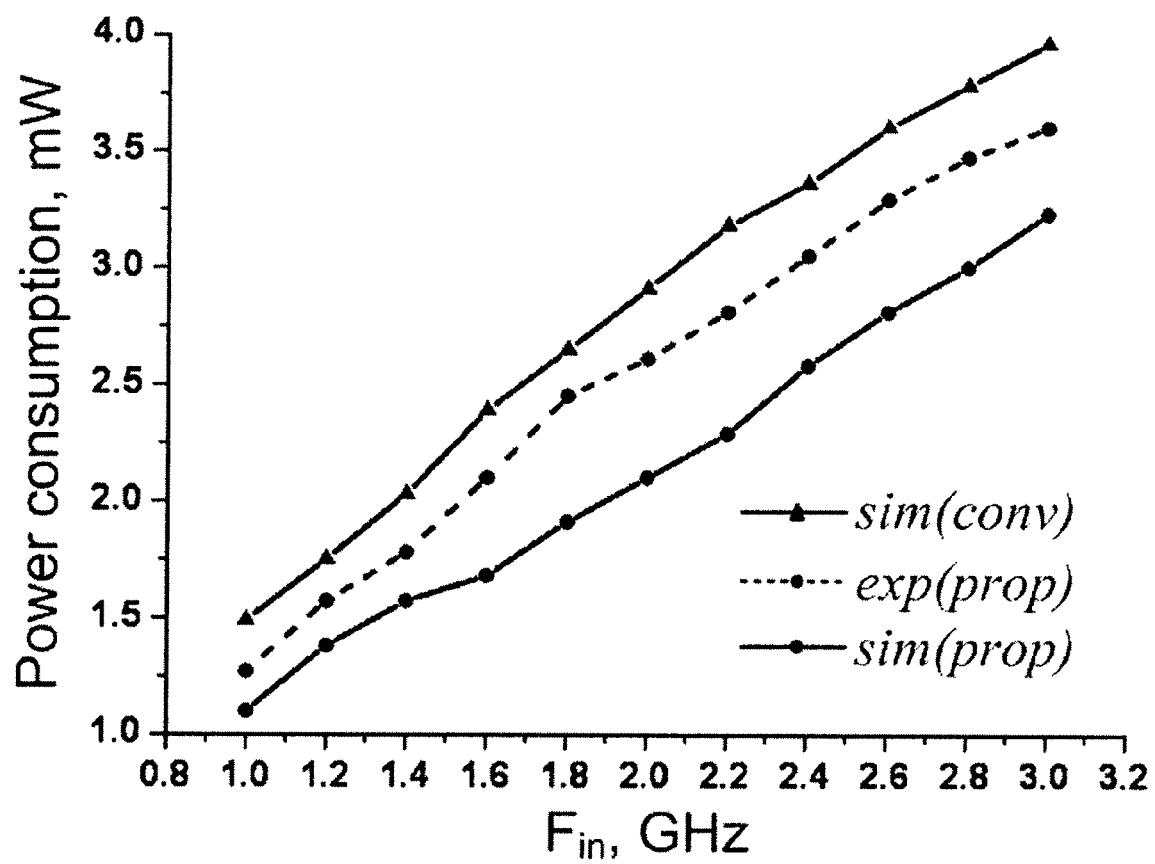
FIG. 6 is a graph showing the measurement results of power consumption with respect to the frequency of an input signal $F_{in}$.

FIG. 6 is a graph showing the measurement results of power consumption with respect to the frequency of the input signal $F_{in}$.

FIG. 6 corresponds to the case where D=74. FIG. 6 shows three cases: the simulation results sim(conv) of the existing frequency divider, the simulation results sim(prop) of the programmable frequency divider according to the present invention, and the actual measurement results exp(prop) of the programmable frequency divider according to the present invention. As the frequency of an input signal increases, power consumption also increases accordingly. However, comparing the three cases to each other, it will be understood that the programmable frequency divider according to the present invention has power consumption lower by more than 30% than the existing frequency divider.

The present invention can be implemented as computer readable codes in a computer readable record medium. The computer readable record medium includes all types of record media in which computer readable data are stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A programmable frequency divider comprising:
   a divided clock generator dividing a frequency of an input clock signal $F_{in}$ by a first divide ratio (N+1) or a second divide ratio N according to a divide ratio control signal MC to generate a plurality of divided clock signals $D_{out}$;
   a counting unit counting a number CNT of the plurality of divided clock signals $D_{out}$, by performing swallow mode counting and program mode counting sequentially on the plurality of divided clock signal $D_{out}$;
   a control signal generator generating the divide ratio control signal MC, using the number CNT of the plurality of divided clock signals $D_{out}$, a count S by the swallow mode counting and a count P by the program mode counting, the count P corresponding to a maximum of the number CNT of the plurality of clock signals $D_{out}$, feeding the divide ratio control signal MC back to the divided clock generator, and generating a reset control signal RST for resetting the counting unit; and
   a selector for selecting and outputting a count $M_{out}$ from among the count S and the count P, using the divide ratio control signal MC fed back from the control signal generator as a selection control signal.

2. The programmable frequency divider of claim 1, wherein the control signal generator comprises:
   a counting mode converter converting a current counting mode for counting the number CNT of the plurality of divided clock signals into the swallow mode counting or the program mode counting, according to which one of the count S and the count P is selected; and
   a RST/MC signal generator generating the divide ratio control signal MC and the reset control signal RST, according to a conversion signal from the counting mode converter.

3. The programmable frequency divider of claim 2, wherein the RST/MC signal generator comprises:
   a first flipflop receiving the conversion signal as a clock signal and dividing the conversion signal by two to generate the divide ratio control signal MC; and
   a second flipflop using a signal in a logic state inverse to that of the conversion signal as a clock signal and receiving a signal in a logic state inverse to that of the divide ratio control signal MC to generate the reset control signal RST.

4. The programmable frequency divider of claim 3, wherein the first flipflop and the second flipflop are D-flipflops.

5. A frequency dividing method comprising:
   dividing a frequency of an input clock signal $F_{in}$ by a first divide ratio (N+1) or a second divide ratio N according to a divide ratio control signal MC to generate a plurality of divided clock signals $D_{out}$;
   counting a number CNT of the plurality of divided clock signals $D_{out}$, by performing swallow mode counting and program mode counting sequentially on the plurality of divided clock signals $D_{out}$;
   generating the divide ratio control signal MC, using the number CNT of the plurality of divided clock signals $D_{out}$, a count S by the swallow mode counting and a count P by the program mode counting, the count P corresponding to a maximum of the number CNT of the plurality of clock signals $D_{out}$, and generating a reset control signal RST for resetting the number CNT of the plurality of divided clock signal $D_{out}$; and
   selecting and outputting a count $M_{out}$ from among the count S and the count P, using the divide ratio control signal MC as a selection control signal.

6. The frequency dividing method of claim 5, wherein the generating of the divide ratio control signal MC comprises:
   generating a counting mode conversion signal for converting a current counting mode for counting the number CNT of the plurality of divided clock signals $D_{out}$ into the swallow mode counting or the program mode counting, according to which one of the count S and the count P is selected; and
   generating the divide ratio control signal MC and the reset control signal RST, according to the counting mode conversion signal.

7. The frequency dividing method of claim 6, wherein the generating of the divide ratio control signal MC and the reset control signal RST comprises:
   dividing the counting mode conversion signal by two to generate the divide ratio control signal MC; and
   generating the reset control signal RST, using a signal in a logic state inverse to that of the counting mode conversion signal and a signal in a logic state inverse to that of the divide ratio control signal MC.

8. A computer-readable recording medium having a program recorded thereon for a computer to execute the method of claim 5.

* * * * *